United States Patent
Karamcheti et al.

(10) Patent No.: US 9,286,002 B1
(45) Date of Patent: Mar. 15, 2016

(54) DYNAMIC RESTRIPING IN NONVOLATILE MEMORY SYSTEMS

(71) Applicant: Virident Systems Inc., Milpitas, CA (US)

(72) Inventors: Vijay Karamcheti, Palo Alto, CA (US); Swamy Gowda, Bangalore (IN); Rajendra Prasad Mishra, Bangalore (IN); Shibabrata Mondal, Bangalore (IN)

(73) Assignee: Virident Systems Inc., Milpitas, CA (US)

( * ) Notice: Subject to any disclaimer, the term of this patent is extended or adjusted under 35 U.S.C. 154(b) by 334 days.

(21) Appl. No.: 13/841,706

(22) Filed: Mar. 15, 2013

Related U.S. Application Data

(60) Provisional application No. 61/746,679, filed on Dec. 28, 2012.

(51) Int. Cl.
| | |
|---|---|
| *G06F 12/00* | (2006.01) |
| *G06F 3/06* | (2006.01) |
| *G06F 11/18* | (2006.01) |
| *G11C 29/00* | (2006.01) |
| *G06F 11/22* | (2006.01) |
| *G06F 11/20* | (2006.01) |

(52) U.S. Cl.
CPC .............. *G06F 3/0647* (2013.01); *G11C 29/70* (2013.01); *G06F 11/18* (2013.01); *G06F 11/20* (2013.01); *G06F 11/22* (2013.01); *G06F 2201/84* (2013.01); *G11C 29/76* (2013.01); *G11C 29/765* (2013.01)

(58) Field of Classification Search
CPC ......... G06F 11/20; G06F 11/18; G06F 11/22; G06F 2201/84; G06F 29/76; G06F 29/765; G06F 29/70
USPC .......................................................... 711/3, 4
See application file for complete search history.

(56) References Cited

U.S. PATENT DOCUMENTS

| | | | | |
|---|---|---|---|---|
| 8,452,929 | B2* | 5/2013 | Bennett | 711/162 |
| 2010/0262773 | A1* | 10/2010 | Borchers et al. | 711/114 |

\* cited by examiner

*Primary Examiner* — Mardochee Chery
(74) *Attorney, Agent, or Firm* — Fish & Richardson P.C.

(57) ABSTRACT

Data is stored as a first collection of memory blocks distributed across a first set of memory devices. It is determined that a first memory device in the first set is in a degraded state. Data is recovered corresponding to a first memory block in the first collection of memory blocks that is stored in the first memory device, which is configured to include a first number of memory blocks. The recovered data is stored in a second memory device as a new memory block, which is added to the first collection of memory blocks. The first memory device is removed from the first set and reconfigured with a second number of memory blocks that is less than the first number of memory blocks. Memory blocks in a second collection of memory blocks distributed across a second set of memory devices is stored in the reconfigured first memory device.

48 Claims, 8 Drawing Sheets

DYNAMIC RESTRIPING IN NONVOLATILE MEMORY SYSTEMS

CROSS-REFERENCE TO RELATED APPLICATION

This application claims priority from U.S. Provisional Application No. 61/746,679, filed Dec. 28, 2012, and titled "Dynamic Restriping in Nonvolatile Memory Systems," which is incorporated by reference.

TECHNICAL FIELD

This document generally relates to dynamically restriping memory components in nonvolatile memory systems.

BACKGROUND

Computer systems typically use memory modules for storing data. Some of the memory modules are realized by memory cards that include non-volatile computer memory, such as flash memory.

SUMMARY

The present disclosure describes methods, systems and devices in which data striping of non-volatile flash memory devices is performed at the granularity of sub-sections of flash memory dice, such as at the level of erase blocks or some other suitable unit of the memory. The data striping optionally includes parity encoding. Methods, systems and devices are also described for dynamically re-striping a flash memory die that includes degraded portions.

In one aspect, data is stored as a first collection of memory blocks distributed across a first set of memory devices. It is determined that a first memory device included in the first set is in a degraded state. Based on determining that the first memory device included in the first set is in the degraded state, data is recovered corresponding to a first memory block included in the first collection of memory blocks that is stored in the first memory device, which is configured to include a first number of memory blocks. The recovered data is stored as a new memory block in a second memory device. The new memory block is added to the first collection of memory blocks. The first memory device is removed from the first set of memory devices. The first memory device is reconfigured with a second number of memory blocks that is less than the first number of memory blocks. Memory blocks included in a second collection of memory blocks that is distributed across a second set of memory devices is stored in the reconfigured first memory device.

Implementations may include one or more of the following features. Storing data as the first collection of memory blocks distributed across the first set of memory devices may comprise computing parity data on the first collection of memory blocks and storing the parity data as a memory block in a memory device. Storing the parity data as a memory block in a memory device may comprise storing the parity data as a memory block in a memory device that is distinct from memory devices included in the first set of memory devices.

Recovering the data may comprise determining the data corresponding to the memory block included in the first collection of memory blocks and stored in the first memory device based on the parity data and remaining memory blocks included in the first collection of memory blocks. The remaining memory blocks may be stored in remaining memory devices included in the first set of memory devices, other than the first memory device.

Data corresponding to the memory blocks stored in the reconfigured first memory device may be replicated based on a priority associated with the data. The data may be replicated using Redundant Array of Independent Disks level 5 (RAID 5) encoding based on determining that the data corresponding to the memory blocks stored in the reconfigured first memory device include user data. The data may be replicated in memory devices that are distinct from the first memory device based on determining that the data corresponding to the memory blocks stored in the reconfigured first memory device include metadata. The metadata may include information associated with at least one of configuration and operation of the memory devices.

Reconfiguring the first memory device with the second number of memory blocks that is less than the first number of memory blocks may comprise reconfiguring the first memory device such that a portion of the first memory device that stored the first memory block is unused, and storing the second number of memory blocks in remaining portions of the first memory device other than the portion of the first memory device that stored the first memory block.

The first set of memory devices and the second set of memory devices may be included in a memory card. At least one memory device may be common to the first set of memory devices and the second set of memory devices.

Storing the memory blocks included in the second collection of memory blocks may comprise computing second parity data on the second collection of memory blocks using a second encoding scheme that is different than a first encoding scheme used for first collection of memory blocks, and storing the second parity data as a memory block in the second set of memory devices. The second encoding scheme may be selected based on a type of data associated with the second collection of memory blocks.

The second set of memory devices may be identified as associated with a degraded memory state based on the second set of memory devices including the first memory device with the degraded state. Responsive to identifying the second set of memory devices as associated with the degraded memory state, storage of a certain category of data in the second set of memory devices may be prevented. The certain category of data may include one of metadata or high-utilization data.

Implementations of the above techniques include a method, a computer program product and a system. The computer program product is suitably embodied in a non-transitory machine-readable medium and includes instructions executable by one or more processors. The instructions are configured to cause the one or more processors to perform the above described actions.

The system includes one or more processors and instructions embedded in a non-transitory machine-readable medium that are executable by the one or more processors. The instructions, when executed, are configured to cause the one or more processors to perform the above described actions.

The details of one or more aspects of the subject matter described in this specification are set forth in the accompanying drawings and the description below. Other features, aspects, and advantages of the subject matter will become apparent from the description, the drawings, and the claims.

DESCRIPTION OF DRAWINGS

Like reference symbols in the various drawings indicate like elements.

DETAILED DESCRIPTION

Figure 1:
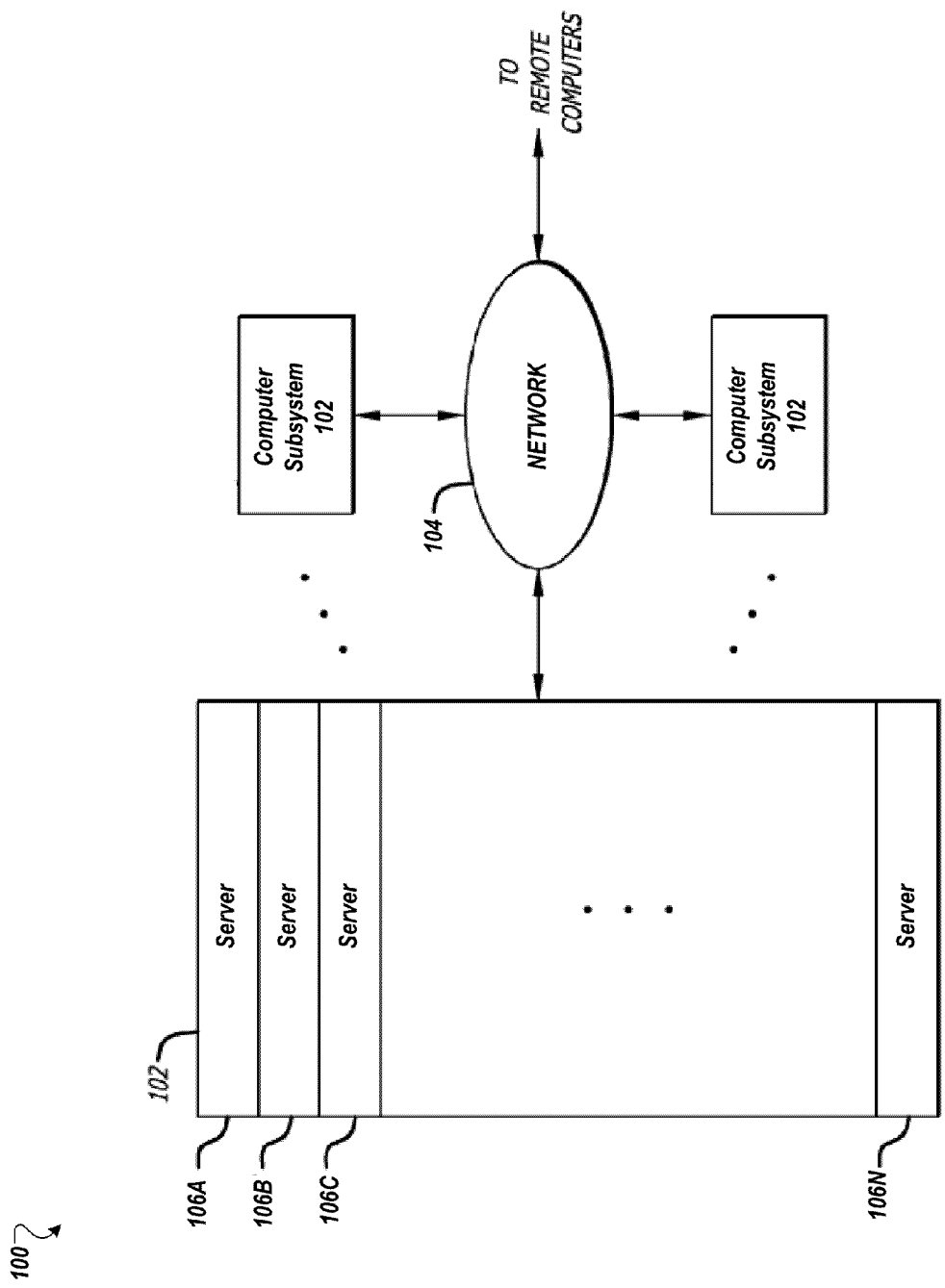
FIG. 1 illustrates an example of a system that uses flash memory for storing data.

Computer systems generally include memory modules that are used in the storage of data and instructions. The memory modules include dynamic random access memory (DRAM) integrated circuits (ICs), which are volatile memory typically used for temporary data storage during processing, and magnetic storage disks for longer term data storage. In some computer systems, in addition or as an alternative to DRAM and magnetic storage disks, non-volatile random access memory (NVRAM) are used for data storage. NVRAM may be configured to provide high-performance random access with a granular degree of access that is comparable to DRAM. At the same time, NVRAM may offer large non-volatile storage capacity, which is comparable to magnetic storage disks, while providing high-density storage that utilizes less physical space as compared to magnetic storage disks. In addition, NVRAM may consume less power than DRAM and magnetic storage disks. Realizations of NVRAM in computer systems include flash memory, such as NAND flash and NOR flash memory, and phase change memory, among others.

In some implementations, flash memory hardware includes memory cards on which flash memory dice, which are integrated circuit memory chips, are affixed. Some computer systems that process data on a large scale, such as enterprise computer systems or server farms, typically use large amounts of memory. Such systems may include memory cards with a large number of flash memory dice or chips on each card. The computer systems may implement techniques like data striping, data mirroring, and parity encoding (akin to Redundant Array of Independent Disks (RAID)) in order to provide performance improvement and data reliability.

In this context, a memory die may be represented or referenced as a memory chip, and the two terms "die" and "chip" may be used interchangeably. In one sense, data striping may refer to a technique of segmenting logically sequential data, such as a file, in a manner such that management and access to sequential logical segments are stored and accessed from locations in different physical storage devices, such as different flash memory dice mounted on a memory card. Each logical segment of data thus created by striping is referred to as a data stripe.

Depending on the application and the environment (for example, load level and configuration), various striping and/or mirroring operations may be performed in order to realize a degree of resiliency and also application and system performance improvement. For example, striping may be useful when a processing device requests access to data more quickly than a storage device can provide access. By performing operations (for example, reads/access operations) on multiple storage devices, multiple segments can be accessed concurrently in a way that provides more data access throughput. This may in turn avoid causing the processor to idle for data accesses.

Data mirroring is the replication of logical memory volumes onto separate physical memory in real time to ensure continuous availability. A mirrored volume is a complete logical representation of separate volume copies. Data mirroring enhances the reliability of data stored in memory by providing redundant copies of the data stored in alternative memory locations.

In addition, or as an alternative, to data mirroring, a combination of striping with redundant encoding of data may be used to realize performance and resiliency improvements. The redundant encoding may be referred to as "parity" encoding operations or measures. In one sense, parity may differ from mirroring in that the parity operations store some data, for example, in an additional flash die, which is not a mirrored copy of data that is stored elsewhere. Instead, the parity encoded data represents a special function of the data (for example, an XOR encoding of the data bits) that is intended to be protected. The property of this special function is that a system may recreate the original data using a subset of the data items and the parity encoded values—the subset that is used is dependent on the function in use. The parity encoded data also may be included in a logical segment that is similar in structure to the data stripes. The logical segment corresponding to the parity encoded data is referred to as a parity stripe. In some implementations, there may be multiple parity stripes for the parity encoded data. The striped data along with the corresponding parity stripes may be referred to as a RAID group. Therefore, a RAID group be distributed across a group of dice and can help recover from die failures using a subset of the data in the array along with the parity encoded values for the array.

In one configuration, a portion (for example, 90%) of an application may use parity encoding while a remaining portion (for example, 10%) may use mirroring to encode data, for example, to manage meta-data and small-block writes. In some systems that employ flash memory, data striping may be performed by distributing a logical unit of data across multiple flash memory dice, along with parity encoding on the distributed logical unit of data for data reliability. In addition, data reliability may be realized for certain classes of data that include metadata by mirroring the data from a flash memory die to one or more other flash memory dice, depending on the level of redundancy that is sought. In such systems, if data in a portion of a flash memory die is corrupted in some manner, then the entire die is typically considered degraded. If data mirroring is employed, another flash memory die, where a redundant copy of the data is stored, is made operational as replacement for the degraded die. The process of making a mirrored die operational may involve an overhead that is greater than the mere percentage loss due to the loss of the originally active die. The overhead may be due to the reconfigured layout of the memory card to account for the failed die, due to the loss in memory bandwidth, or some other appropriate reason. Therefore, the loss of an entire flash memory die due to corruption in a portion of the die, the overhead in replacing the failed die with a redundant copy, or both, may have an adverse impact on the performance of the overall computer system.

It may be useful to implement techniques and systems by which a flash memory die is maintained in an operational state even if a portion of the die is in a degraded state. In some implementations, such a computer system may be realized by performing data striping for granular sub-sections of a flash memory die, and parity encoding the data in the granular subsections across multiple flash memory dice. In addition, mirroring of some other granular subsections of data may be performed across multiple flash memory dice. In this context, a sub-section of a flash memory die may be a region of flash within a die, such as a write page, an erase block, a sector or some suitable logical or physical portion of the flash memory die. When a portion of a memory die is in a degraded state, only the data in the degraded portion of the memory die may be restored using parity restoration operations. Subsequently, the flash memory die is dynamically re-striped with appropriate selection of redundancy mechanisms, taking into account the degraded portion of the memory die. The priority of the data that is stored in the re-striped portions may be considered for determining a level of redundancy for the particular data stripe.

Methods, systems and devices are described in the following sections for performing data striping, optionally with parity encoding, at the granularity of sub-sections of flash memory dice, such as at the level of erase blocks or some other suitable unit of the memory. Methods, systems and devices are also described for dynamically re-striping a flash memory die that includes degraded portions. For the purposes of this discussion, the terms flash memory die, flash memory chip and flash memory are used synonymously. In addition, though the remaining sections are described in reference to flash memory, the techniques described here may be applicable to other forms of memory devices with aspects of asymmetric behavior. For example, phase change memory may be configured to employ these operations. In addition, there are competing trends that may increase the impact of these operations. One trend is increased memory density and stacking, which makes the size of memory accesses less granular. A competing trend is the increasing ability to include additional logic that makes more granular access available. Depending on the relative allocation of increased density relative to increased granularity, a memory controller may quantify the impact of various restriping operations to reflect a current performance point relative to the tradeoffs.

FIG. 1 illustrates an example of a system 100 that uses flash memory for storing data. The system 100 may implement techniques for performing data striping at the granularity of sub-sections of a flash memory die, and for dynamically re-striping a flash memory die that includes degraded portions.

The system 100 includes one or more computer subsystems 102 that are interconnected by a network 104. A computer subsystem 102 includes one or more servers such as 106A, 106B and 106C through 106N.

Each computer subsystem 102 may be a server rack that hosts an array of servers, such as 106A, 106B, 106C and 106N. This may be the case, for example, when the system 100 is a server farm or a back end processing center for an enterprise. The computer subsystems may be co-located at one physical location, such as in a data center, or they may be geographically distributed.

The computer subsystems 102 communicate with each other and with remote computers via the network 104, which may include a circuit-switched data network, a packet-switched data network, or any other network able to carry data, such as Internet Protocol (IP)-based or asynchronous transfer mode (ATM)-based networks, including wired or wireless networks. The network 104 may be a Local Area Network (LAN) or a Wide Area Network (WAN). The network 104 may include the Internet, analog or digital wired and wireless networks (such as IEEE 802.11 networks, Public Switched Telephone Network (PSTN), Integrated Services Digital Network (ISDN), and Digital Subscriber Line (xDSL)), Third Generation (3G) or Fourth Generation (4G) mobile telecommunications networks, a wired Ethernet network, a private network such as an intranet and/or any other delivery or tunneling mechanism for carrying data, or any appropriate combination of such networks. In addition, the network 104 may be configured to handle secure traffic such as secure hypertext transfer protocol traffic (HTTPS) or virtual private networks (VPN) such that the connections between the computer subsystems 102 may be secure connections, such as using VPN or HTTPS. However, in other implementations, the connections may be unsecured connections.

Each server 106A, 106B, 106C or 106N is a computing device that includes memory modules for storing data, such as hard drives and flash memory. The flash memory may be in the form of memory cards on which multiple flash memory chips are affixed. A flash memory card may include multiple memory packages or die packages, also referred simply as packages. A package is a multi-chip module that includes one or more flash memory dice. Each flash memory die may be composed of flash planes that include constituent blocks of memory cells where data are stored. In some implementations, a die with two planes has two distinct sub-regions, each sub-region with its own memory array and interface circuitry. The die has a demultiplexing structure that sends commands to one plane or the other (or in some cases, to both planes). The memory cells may be single-level cells (SLCs), which store a binary digit (bit) corresponding to the value of the data that is stored in the particular memory cell. Alternatively, a memory cell may be a multi-level cell (MLC), which are configured to store several bits corresponding to the value of the data stored in the logical write page locations associated with the particular memory cell.

Each server may include multiple instances (for example, up to 16 to 24) of such flash memory cards that are connected to a motherboard in the server, yielding total flash memory capacity that may vary in range from 0.5 terabytes (TB) for a smaller memory card or system to around 100 TB capacity for a larger memory card. From the perspective of a flash memory card, the server in which the memory card is included may be considered as the host system for the memory card. Therefore, based on the above exemplary figures, the total capacity of the host system may range from 0.5 TB to 100 TB, multiplied by the number of cards in the system.

As mentioned previously, flash memory is a form of NVRAM, which is a type of random-access memory that retains its information when power is turned off (hence, non-volatile). This is in contrast to DRAM and static random-access memory (SRAM), which both maintain data only for as long as power is applied. NVRAM has asymmetric properties, in which the constituent operations, such as memory reads, writes, or erases, differ from each other by one or more orders of magnitude. For example, memory reads are performed within the same order of magnitude as the operations are performed in DRAM, memory write operations are performed much slower in comparison, and erase operations have even bigger limitations. Furthermore, certain types of NVRAM modules may have a limited number of writes. This may be the case, for example, due to the physical characteristics present in some types of NVRAM information storage mechanisms, which allow each NVRAM physical cell to be programmed and/or erased a limited number of times. Different types of NVRAM may have different analog properties (the underlying "noisy media" characteristics) depending on the underlying physical mechanism and density of the memory cell.

Each server also includes processors for processing data stored in the memory modules. In some implementations, the processors are present in the host system, for example, in the motherboard in the server to which the memory cards are coupled. In such implementations, the management of the flash memory may be performed by the host system. In some other implementations, one or more processors may be embedded in the flash memory cards. In such implementations, the management of the flash memory may be performed by the processors embedded in the memory card itself, or by some suitable combination of the processors embedded in the memory card and the processors in the host system.

The processors may be configured to execute instructions that are stored in the flash memory or elsewhere, such as in read-only memory (ROM). The instructions may include instructions for processing the data, for performing data striping at the granularity of sub-sections of flash memory chips, for recovering data stripes with degraded memory sections by dynamically re-striping the sections of flash memory chips that include degraded regions.

Each server also may include DRAM for temporary storage of data during processing operations. In addition, each server includes network interfaces for communicating with other servers on the same computer subsystem 102 or in other computer subsystems or remote computers.

Figure 2A:
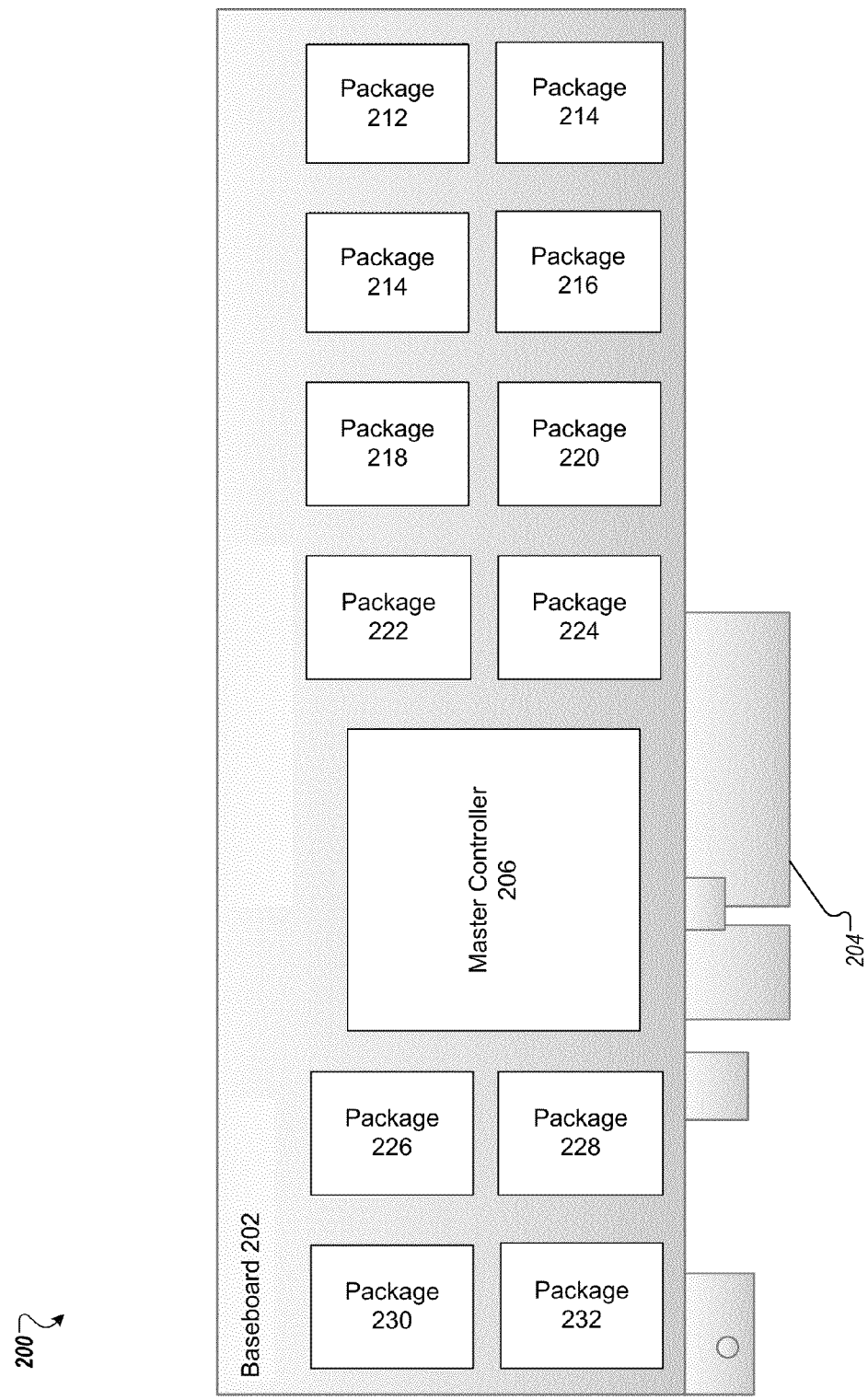
FIGS. 2A-2B illustrate an example of a memory card that includes flash memory chips.
Figure 2B:
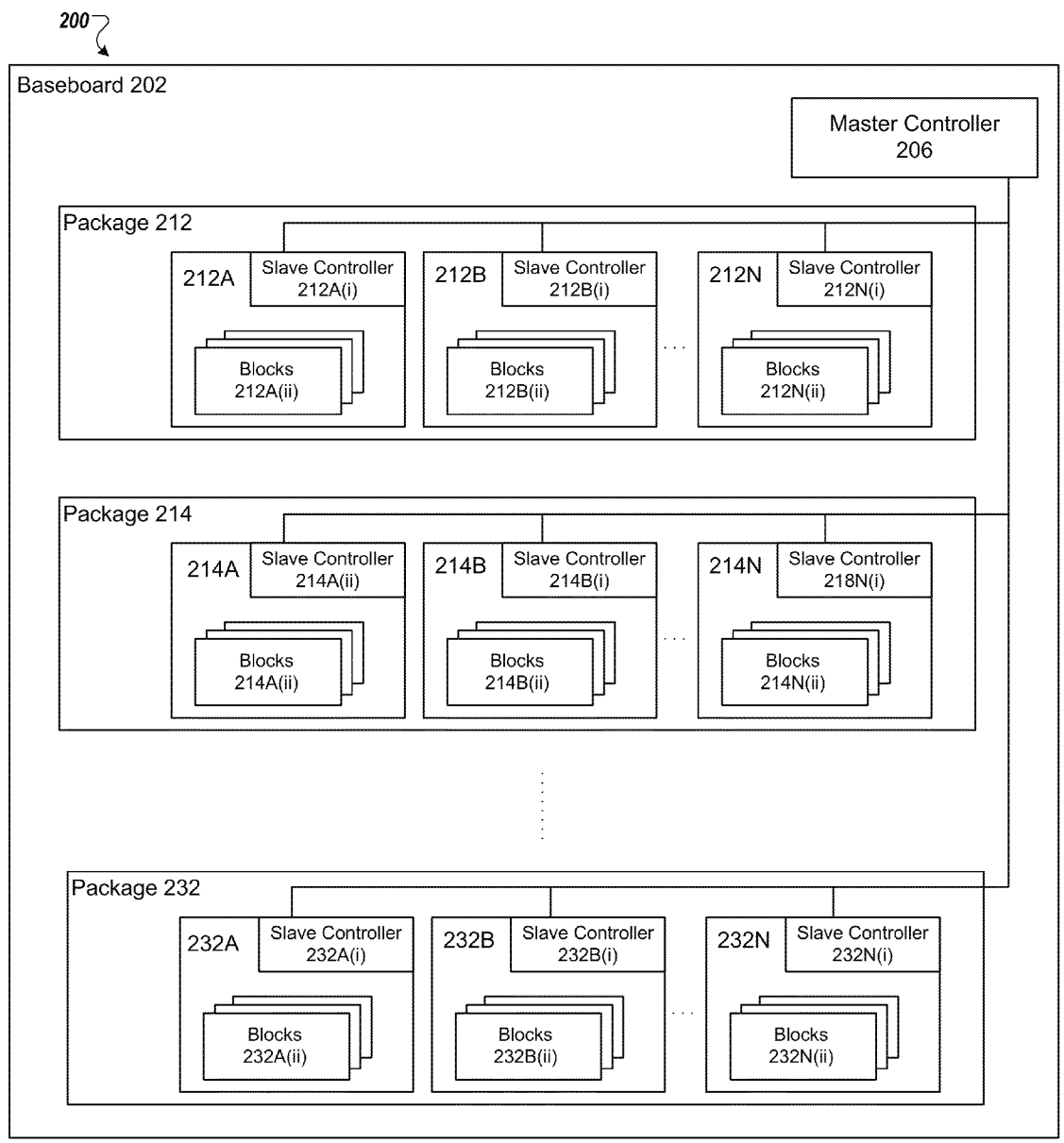

FIGS. 2A-2B illustrate an example of a memory card 200 that includes flash memory chips. The memory card 200 may be included, for example, in a server in the system 100, such as one of servers 106A, 106B, 106C and 106N. However, the memory card 200 also may be included in other systems.

FIG. 2A shows a schematic of the memory card 200 viewed from one side. As shown, the memory card 200 includes a baseboard 202 with a host edge connector 204. A master controller 206 is mounted on the baseboard 202. Also mounted on the baseboard 202 are one or more memory packages, such as packages 212-232.

The baseboard 202 is a printed circuit board (PCB) that includes one or more layers of printed circuit board traces for interconnecting the various components of the memory card 200, including the master controller 206 and the different packages 212-232. The baseboard 202 may be of a form factor that allows the memory card 200 to be included within the chassis of a server, such as 106A, 106B, 106C or 106N. In some implementations, the baseboard 202 may be configured to support a daughter board, which may be used to expand the memory capacity of the memory card 200. For example, the baseboard 202 may include sockets to which a daughter board may be coupled. The daughter board may include a number of memory packages that are similar to the packages 212-232, thereby increasing the total memory capacity of the memory card 200.

The host edge connector 204 is adapted to couple to sockets mounted to a motherboard of the host system. For example, the connector 204 may couple the memory card 200 to the motherboard included in any of the servers 106A, 106B, 106C or 106N. The connector 204 is a computer data bus connector that is configured for transferring data between the memory card 200 and the host system. For example, the connector 204 may be a Peripheral Component Interconnect (PCI) bus, a PCI-eXtended (PCI-X) bus, a PCI Express (PCIe) computer expansion bus, or some other suitable connector.

The master controller 206 is a processing device that is configured for managing the storage and retrieval of data in the flash memory chips included in the memory card 200. In some implementations, the memory card 200 includes multiple master controllers 206. In some implementations, the master controller 206 manages one or more slave controllers that are included in the packages 212-232 and coupled to the master controller 206 by a plurality of master-slave memory bus channels. In some other implementations, the slave controllers are included in the same logical unit (such as a package) as the master controller, while retaining the logical differences between the master and slave controllers. In yet other implementations, the master controller 206 manages one or more slave controllers that are external to the packages 212-232. For example, the slave controllers may be placed between the master controller(s) and the flash memory dice. The master controller(s) communicate with the slave controllers through master-slave memory bus channels. Each slave controller in turn communicates with a subset of the flash memory dice, using, for example, a separate channel controller to control each die.

A host bus channel formed of traces of the baseboard 202 may couple the master controller 206 to the host edge connector 204 for communicating with the host system. The one or more slave controllers are adapted to provide transparent access to the flash memory included in the packages. The master controller 206 and the slave controllers provide native access of the flash memory to the processors in the host system.

Each of the packages 212-232 includes a rectangular printed circuit board on which is mounted a plurality of packaged flash memory chips. The flash memory chips may include NAND flash memory die, NOR flash memory die, or any other suitable non-volatile memory. In some implementations, each of the packages 212-232 may have different types of flash memory that can be identified to the memory card 200 so that read operations, write operations, and/or erase or maintenance operations can be tailored to the given type of memory.

In some implementations, each package includes 8 NAND flash memory dice, which are arranged in 4 pairings based on electrical wiring and pin outs that come out of the package, among other parameters. The two dice in a pair may be referred to as siblings of each other. The package is configured such that for each pair, one of the dice may be active for performing input/output (I/O) operations at a time, even though both dice may be considered active from a flash operation point of view. Therefore, in a package, 4 of the dice may perform input/output (I/O) operations concurrently, but all 8 dice may be active for performing flash operations.

In the above implementations, in addition to the 12 packages 212-232 that are shown, the memory card 200 includes 12 more packages mounted on the reverse side of the baseboard 202, yielding a total of 24 packages mounted on the baseboard 202. In addition, the memory card 200 includes the daughter board, with 24 packages mounted on the daughter board. Therefore, in such implementations, the total number of packages in the memory card 200 is 48. For 8 dice per package, the above configuration yields a total of 384 flash memory dice in the memory card 200.

In alternative implementations, the number of packages 212-232 may be other than 12, for example, some tens of packages, and the memory card 200 may include additional tens of packages mounted on the reverse side of the baseboard 202, yielding a total number of packages per board that is a number other than 24. With multiple boards per card, such as one or more daughter boards, the total number of packages in the memory card may be in the tens or hundreds, leading to multiple hundreds or thousands of dice.

In addition to the features shown in FIG. 2A, the memory card 200 may include one or more embedded processors, ROM, DRAM and additional NVRAM that are mounted to the baseboard 202. The ROM may be configured to store boot instructions for the memory card 200. The DRAM may be configured to provide scratch pad memory to the embedded processors and store translation structures (for example, a translation table mapping logical addresses to physical addresses) to access data in the flash memory chips. The NVRAM may include firmware instructions for the memory card 200 that may be periodically upgraded. The firmware instructions drive and control the master controller 206 and the and slave memory controllers to perform read, write, erase or maintenance operations to access data with the flash memory chips of the packages 212-232. The embedded processors execute the firmware instructions to drive and control the master and slave memory controllers to access data as well as read, write, and maintain the translation structures in the DRAM.

The embedded processors may be further coupled to the master memory controller 206 and the edge connector 204 to communicate with each. The embedded processors also may be in communication with the host processors in the host system over the edge connector 204 to receive read and write operation requests from the host application or host operating system software to access data in the flash memory dice in the memory card 200.

As described previously, each memory card 200 may have two types of logical controllers, namely, the master controller, which handles host-level interactions, and slave controller(s), which handles flash-level interactions. The master controller and the slave controller(s) may communicate using standard protocols, or a proprietary hardware interface, or any suitable combination of both. In some implementations, this interface is implemented using pins on the physical devices and traces on the baseboard. In other implementations in which master controller and slave controller(s) are in the same physical device, the interface may be implemented using internal device logic on the physical device.

In some implementations, a memory card 200 may utilize two physical devices—each of which implements one master controller and several slave controllers. One of the master controllers may be on the "baseboard" on the PCI expansion slot on the mother board of the computing device, and the other master controller may be on the "daughter board" located on an expansion slot on the baseboard. Communication between the host and the daughter board's master controller may be routed through the baseboard's master controller. In such implementations, communication between the two master controllers may be through the standard interface of PCIe. A proprietary hardware interface also may be feasible.

The master controller(s) and slave controller(s) coordinate their respective actions to implement the data path of the flash memory system. In this context, the data path, which may also be referred to as the data plane, indicates that that the master and slave controllers do not themselves determine which flash memory locations are involved in the memory operations. Instead, the determination is made by the control path or control plane of the system. The master and slave controllers receive commands from the "control path" to perform flash-level operations and carry out such operations against specified host DRAM resources.

The control path of the system may be implemented by the driver software, which may be implemented as firmware instructions executed by the host processor or embedded processors associated with the controllers. In some implementations, there may be a single driver per card, while in other implementations, there may be several drivers per memory card. The driver software instructions may enable each slave controller to communicate independently with the master controller(s).

In some implementations, the driver software runs on the host computing device as a device driver. The device driver communicates with the master controller(s) on the memory card using standard PCIe commands—in standard terminology, the latter may be referred to as "memory mapped I/O" (MMIO) instructions (they are load/store instructions at the processor level, except that they get routed to the appropriate device instead of DRAM). The driver in turn receives requests from host central processing unit (CPU) applications and operating system (for example, the file system component) using standard host-based application programming interfaces (APIs) and mechanisms (for example, a system call).

In some other implementations, the driver software runs on an embedded processor coupled with the baseboard master controller. In these implementations, the term "firmware" is usually used to denote the driver software. In still other implementations, the driver functionality may run in a split/parallel fashion across more than one embedded processor associated with one or more master controllers. In cases where the firmware runs on one or more embedded processors, the applications/operating system requests get communicated to the firmware using the same PCIe memory mapped I/O instructions, using an intermediate (separate, minimal) software driver, for example, installed on the host computing device.

FIG. 2B illustrates a schematic of the memory card 200 showing the flash memory dice included in the packages 212, 214 and 232, which are a subset of the packages 212-232. Package 212 includes flash memory dice 212A ... 212N, package 214 includes flash memory dice 214A ... 214N and package 232 includes flash memory dice 232A ... 232N. Each of the dice 212A ... 212N includes a slave controller, such as 212A(i)-212N(i) and memory blocks 212A(ii)-212N(ii) respectively. Each of the dice 214A ... 214N includes a slave controller, such as 214A(i)-214N(i) respectively, along with memory blocks 214A(ii)-214N(ii) respectively. Similarly, each of the dice 232A ... 232N includes a slave controller 232A(i)-232N(i) respectively and memory blocks 232A(ii)-232N(ii) respectively.

Although FIG. 2B shows the slave controllers 212A(i)-212N(i), 214A(i)-214N(i) and 232A(i)-232N(i) are mounted to the packages 212-232 and coupled between the master controller 206 and the plurality of flash memory dice, in some other implementations, the slave controllers 212A(i)-212N(i), 214A(i)-214N(i) and 232A(i)-232N(i) are mounted to the baseboard 202 and coupled between the master controller 206 and the respective flash memory dice in the packages 212-232. In yet other implementations, the slave controllers 212A(i)-212N(i), 214A(i)-214N(i) and 232A(i)-232N(i) are mounted together in an integrated circuit package with the master controller 206 and coupled between the master controller 206 and the respective flash memory dice in the packages 212-232.

Each slave controller is configured for providing transparent access to its respective die. As described previously, all the slave controllers are connected to the master controller 206 by a plurality of master-slave memory bus channels, which may be implemented as PCB traces on the baseboard 202. The master controller 206 natively controls the flash memory dice to obtain predictable bandwidth and latency performance with the flash memory dice included in the packages 212-232. All operations that take place on the flash memory dice 212A ... 212N, 214A ... 214N or 232A ... 232N (for example, read, write, erase, control operations such as reset, etc.) are completely visible to (and under the control of) the master controller 206. The flash memory interface of active dice of the dice in a package is passed through the respective slave memory controller to the master controller 206. For example, the flash memory interface of the die 212A is passed through the slave controller 212A(i) to the master controller 206.

The master controller 206 is able to exercise directly each of the operations that are supported by the flash memory dice 212A . . . 212N, 214A . . . 214N or 232A . . . 232N. The slave controllers may perform protocol conversion, but do not drop/intercept (without involving the associated flash memory die) a request from the master controller. However, the slave controllers do not autonomously initiate any flash memory operation.

Each slave controller 212A(i)-212N(i), 214A(i)-214N(i) and 232A(i)-232N(i) is configured to arbitrate memory bus channels shared by the multiple flash memory dice 212A . . . 212N, 214A . . . 214N and 232A . . . 232N respectively. Each slave controller can buffer and multiplex signals between the master controller 206 and the multiple flash memory dice. In addition, each slave controller can combine a sequence of predictable non-volatile memory operations together into a compound operation to improve control bandwidth with the flash memory dice.

In some implementations, the data in the flash memory dice 212A . . . 212N, 214A . . . 214N and 232A . . . 232N may be accessed in units of memory that are termed memory blocks or memory pages. For example, the flash memory die 212A includes multiple memory blocks that are indicated collectively by 212A(ii) in FIG. 2B. The size of a memory block may vary based on the type of flash memory that is used. For example, the size of a memory block may be different for NAND flash dice and NOR flash dice. Among NAND flash devices, the sizes may be different between SLC and MLC types of NAND flash. NAND flash from different process generations also may have different sizes (for example, 34 nanometers NAND flash versus 25 nanometers NAND flash). In addition, the size of a memory block may vary based on the type of operation that is performed on the flash memory device. For example, for a NAND flash memory die, data may be written to the memory device in units of write pages. The size of a write page may be small, in the order of a small number of kilobytes (KB) (for example, in the range 4 KB-16 KB). However, data may be erased from the NAND flash die in units of erase blocks, which are typically larger in size than the write pages (in the order of several megabytes) and one erase block may include multiple write pages. Once data is written to a write page, the entire erase block associated with the write page has to be erased before new data can be written to the write page. Multiple erase blocks in a flash memory die, such as 212A, may be grouped together into a flash plane. The flash memory die may be composed of multiple such flash planes.

In some implementations, regions of one or more flash memory dice in the memory card 200 may be defective. For example, some storage cells in a flash memory die may wear out due to normal wear and tear during operation of the memory card 200. In conventional systems, when a portion of a flash memory die wears out, the entire flash memory die may be replaced by another die in which the data of the failed die is replicated or into which the original data can be restored using replication along with parity reconstruction across the associated RAID group. For example, the flash memory die 212B may replicate all the data chunks that are stored in the flash memory die 212A. When one or more blocks 212A(ii) are in a degraded state, the flash memory die 212A may be replaced by the flash memory die 212B. However, as indicated previously, replacing an entire die when only a portion of the die may be in a degraded state can have an adverse impact on the performance of the memory card 200, and consequently, on the performance of the overall system. In some implementations, once the memory card 200 is deployed in a host system, faulty die cannot be replaced. Therefore, mechanisms may be implemented such that the card will continue to operate over its lifetime even when multiple flash memory dice on the card go bad.

Figure 3:
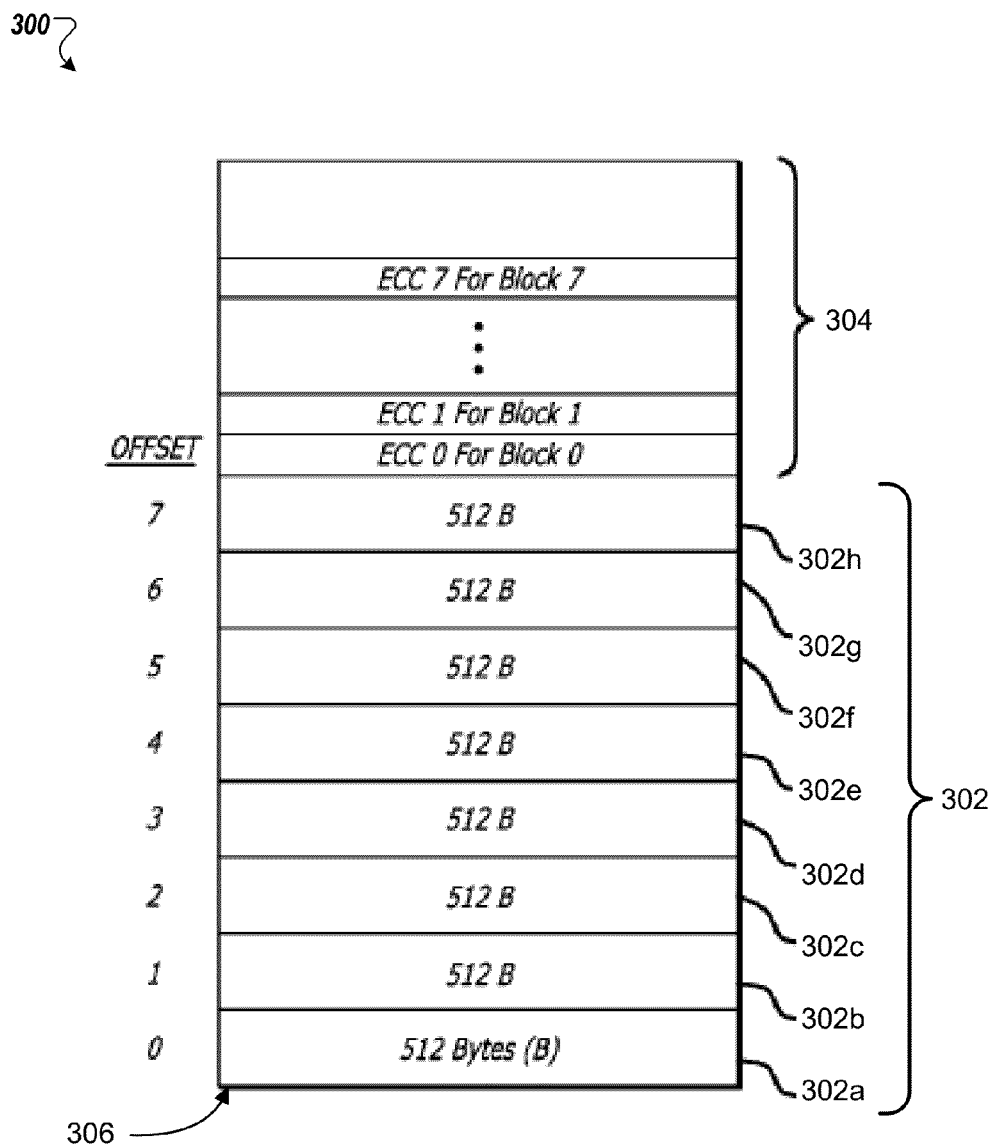
FIG. 3 illustrates an example of a memory page that is stored in a flash memory chip.

FIG. 3 illustrates an example of a memory page 300 that is stored in a flash memory chip. The flash memory chip may be one of 212A . . . 212N, 214A . . . 214N and 232A . . . 232N that are packaged in the memory card 200. However, the flash memory chip also may be implemented in other memory cards or systems.

The memory page 300 includes a data portion 302 and an error correction code (ECC) portion 304. The data portion 302 includes memory units 302a-302h in which data is stored. The memory page has a page starting address indicated by 306.

The size of the data portion may vary depending on the particular NVRAM design and configuration. In the example shown, the data portion 302 has a size of 4 KB. Other sizes for the data portion may be used (for example, 8 KB or 16 KB).

As shown in FIG. 3, the memory page 300 has an offset address indicated by zero through seven from the page starting address 306, which allows each of the memory units 302a-302h to be 512 bytes in size. In some implementations, each of the memory units 302a-302h may correspond to a write page, while the data portion 302 may correspond to an erase block. Therefore, in such implementations, the erase block 302 includes the write pages 302a-302h.

The size of the ECC varies with the underlying NVRAM implementation. For the configuration where the data portion 302 is 4 KB, the ECC portion 304 is 128 bytes. In other implementations, the size of the ECC portion may be higher (such as in the range of 500 bytes) to meet the higher media error rates of data portions of larger size (for example, for more current generations of flash devices such as MLC type memory).

The ECC portion 304 is used to store ECC data that is used for error correction of data stored in 302a-302h. An error correction code may be generated for each 512 byte unit 302a-302h. Program write errors or flash read errors may be detected using the error correction code. While ECC is useful to correct an a priori anticipated threshold of bit errors, redundant data storage may be used to recover data when the number of bit errors exceeds the a priori threshold or due to a complete failure of a storage device, such as the flash memory die in which the memory page 300 is included.

In some implementations, data may be stored in one or more 512 byte regions across a memory page with one or more consecutive offset addresses respectively. The region in which data is stored may be referred to as a chunk of memory. For example, employing a single offset address allows a 512 byte chunk of data to be stored across one of the units 302a-302h of the memory page 300. A RAID group in this case may be consistently written with regions of 512 byte chunks of data. This may be the case, for example, with 7 data stripes and 1 parity stripe spread across 8 flash memory dice that implement 4 KB memory pages, such as the page 300. In this configuration, each die sees a 512 byte region for each stripe within the same memory page.

In some other implementations, a pair of offset addresses (for example, offset addresses 6 and 7) may be used to allow 1 KB chunks of data to be stored in regions of the memory page 300. A RAID group in this case may be consistently written with regions of 1 KB chunks of data. This may be the case with three data stripes and one parity stripe spread across four flash memory devices with 4 KB memory pages, such as the memory page 300. In this configuration, each die sees a 1 KB region for each stripe within the same memory page.

In some implementations, a software driver or embedded firmware operating on the host system may accumulate data, calculate parity, and store the data and parity information as stripes across the flash memory dice. The parity calculations may be performed by the host processors, for example, based on instructions of the host software driver or embedded firmware. In other implementations, the software driver operating on the memory card 200 may accumulate the data and initiate a command to the master controller 206. The master controller 206 can then be responsible for computing the parity information and storing the data and parity stripes across the flash memory dice.

The memory card 200 may include several such RAID groups. For example, referring to the implementation of the memory card 200 with 48 packages with 8 dice per package, the memory card 200 may include 24 RAID groups, with 16 dice in 2 packages in each group.

Figure 4A:
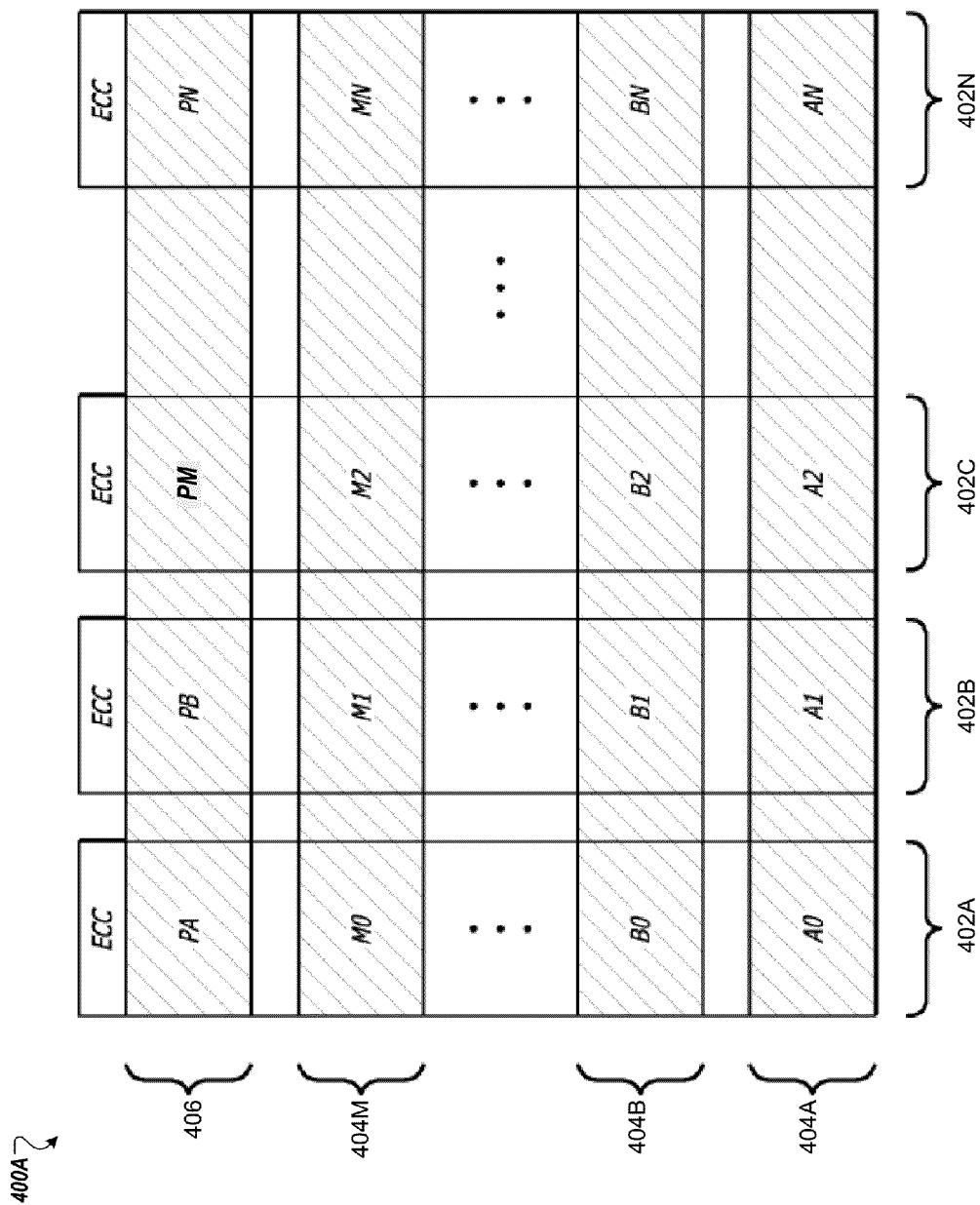
FIGS. 4A and 4B-4C illustrate examples of groups of flash memory dice storing data redundantly in data stripes distributed across the flash memory dice.
Figure 4B:
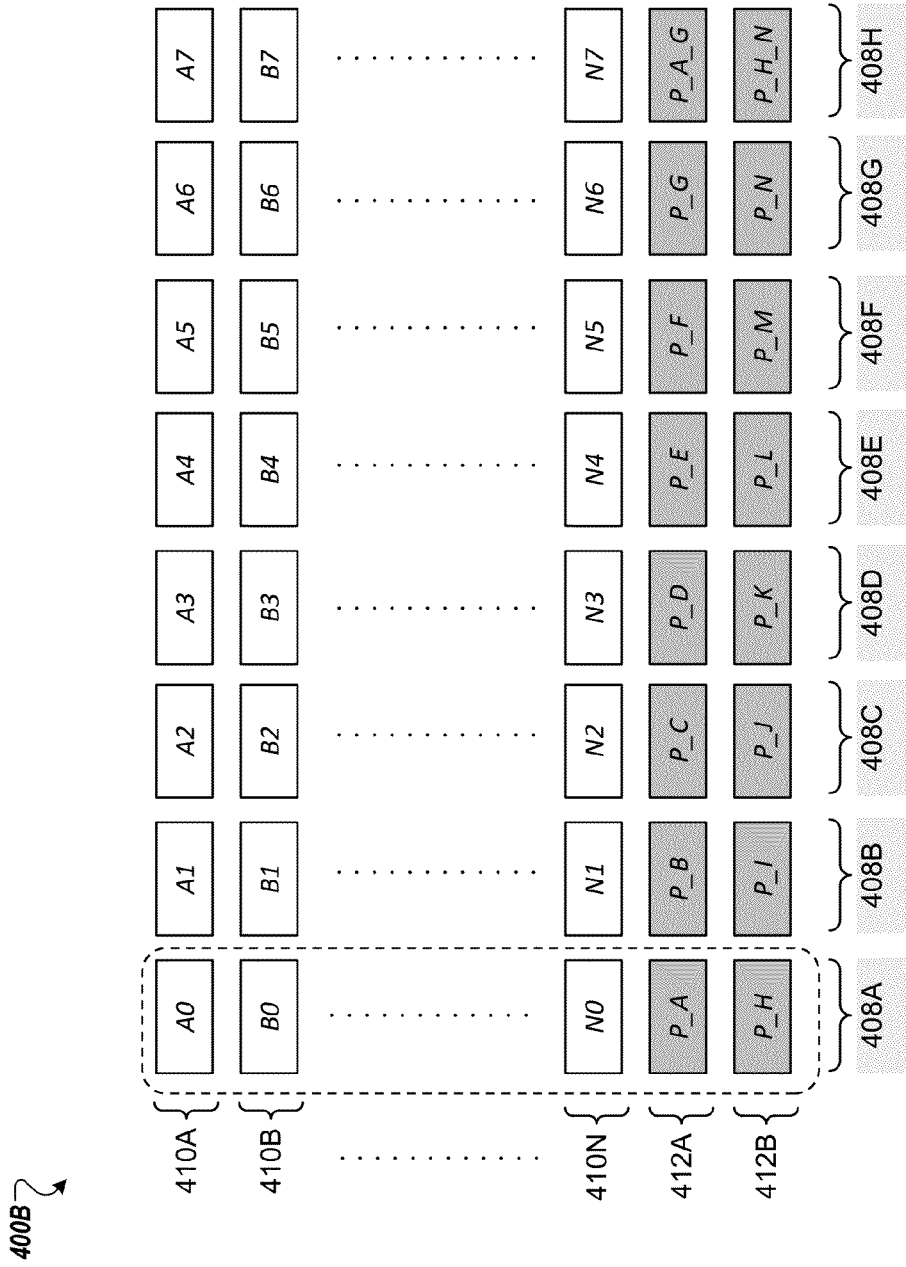
Figure 4C:
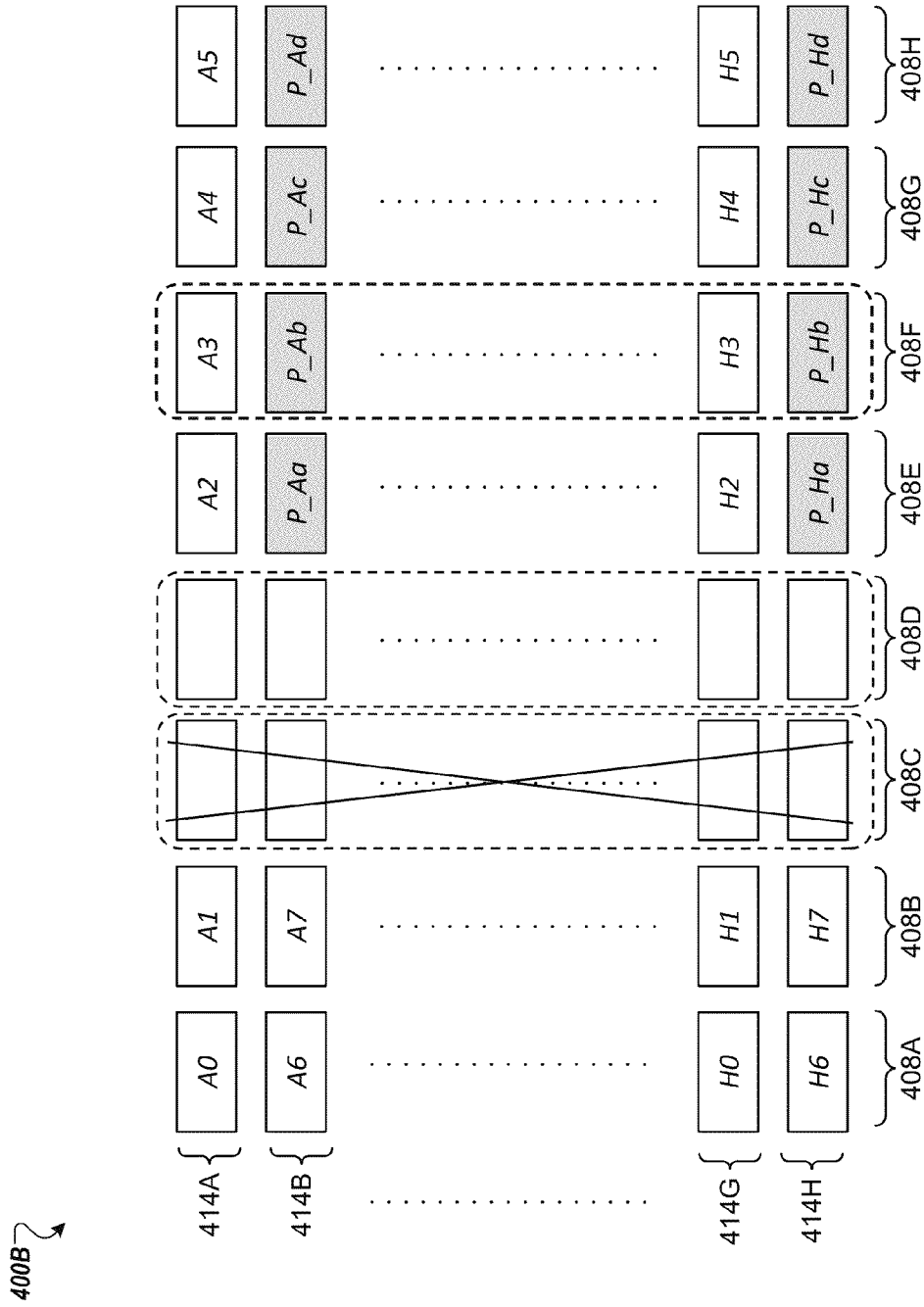

FIGS. 4A and 4B-4C illustrate examples of groups of flash memory dice 400A and 400B, respectively, storing data redundantly in data stripes distributed across the group of flash memory dice. The flash memory dice may be mounted on the memory card 200. For example, the flash memory dice may be 212A . . . 212N, 214A . . . 214N and 232A . . . 232N that are packaged in the memory card 200. Accordingly, the following sections describe the groups of flash memory dice 400A and 400B as implemented by the card 200 in the system 100. However, the groups of flash memory dice 400A and 400B also may be implemented by other memory cards and systems.

The group 400A shown in FIG. 4A illustrates one implementation of a flash-aware RAID data layout. The group 400A includes N flash memory dice 402A, 402B, and 402C through 402N, collectively referred as 402A . . . 402N. Pages of data are stored across the flash memory dice 402A . . . 402N in M data stripes 404A and 404B through 404M, collectively referred as 404A . . . 404M. Each stripe includes N data chunks, such as A0 . . . AN for data stripe 404A, B0 . . . BN for data stripe 404B and M0 . . . MN for data stripe 404M. A parity stripe 406 is also stored across the flash memory dice 402A . . . 402N. The parity stripe is formed of parity chunks PA-PM and a single meta-data parity chunk PN. It is to be noted that various configurations may be used other than the configuration shown. For example, different encoding of the parity stripe may be used that group the parity information across multiple data stripes. Similarly, the parity information may be stored as part of the individual data stripes instead of being stored in a separate parity-only stripe.

The flash memory dice 402A . . . 402N may be same as the flash memory dice 212A . . . 212N, or 214A . . . 214N, or 232A . . . 232N. The size of each data chunk may depend on the number of flash memory dice that are used, and the number of data stripes. Each data chunk may have a size same as a write page, or an erase block, or some other suitable size unit of memory. For each data stripe, a corresponding parity chunk is generated by computing parity of the data chunks included in the data stripe that are stored in the flash memory dice. For example, PA is the parity chunk for the data stripe 404A; therefore, PA may be computed based on the data chunks A0 . . . AN. The meta-data parity chunk PN is parity computed from the plurality of parity chunks previously generated. Therefore, PN is computed based on the parity chunks PA . . . PN.

In some implementations, the parity chunks and the meta-data parity chunk in the parity stripe are selectively stored on differing flash memory die so that data can be recovered in response to a failure, removal, and replacement of a flash memory die. Each data chunk in a stripe is also stored in a different flash memory die so that data can be recovered in response to a failure, removal, and replacement of a flash memory die. For example, for the data stripe A, the data chunk A0 is stored in the flash memory die 402A, data chunk A1 is stored in the flash memory die 40B, data chunk A2 is stored in the flash memory die 402C, and the data chunk AN is stored in the flash memory die 402N.

The parity chunks and the meta-parity chunk can be stored arbitrarily across the flash memory dice 402A . . . 402N provided their locations are known. For example, as shown, the PA chunk in the parity stripe 406 is stored in the flash memory die 402A, the PB parity chunk is stored in the flash memory die 402B, the PC parity chunk is stored in the flash memory die 402C, and the meta-parity chunk PN of the parity stripe 406 is stored in the flash memory die 402N. In another implementation, the meta-parity chunk PN may be stored in the flash memory die 402A, the PA parity chunk may be stored in the flash memory die 402B, the PB parity chunk may be stored in the flash memory die 402C, and the PC parity chunk may be stored in the flash memory die 402N.

In a particular flash memory die, data chunks from each data stripe and a parity chunk are stored in different 512 byte or 1 KB regions of the same flash write page or erase block. For example, the A0 data chunk in the data stripe 404A, the B0 data chunk in the data stripe 404B, the M0 data chunk in the data stripe 404M and the PA parity chunk are stored in different regions of the same size in the same flash memory page in the same flash memory die 402A. The data stripes and the parity stripe are stored at different offsets in the flash write page or erase block. Each flash write page or erase block for the flash memory dice 402A . . . 402N is logically written in a similar format.

As indicated previously, a RAID (or RAID group) or similar configuration may be used to provide data reliability to the data stored in the flash memory dice 402A . . . 402N. For example, to provide RAID-like reliability, four, eight, or sixteen flash memory dice may be used. The RAID group may reside across other number of dice.

As shown, M data stripes and one parity stripe are written across N flash memory dice 402A through 402N for each flash write page. The data and parity are striped across multiple write pages, erase blocks or some other suitable memory unit in the different flash memory dice. The data stripes and parity stripes are written to different offsets within one or a couple of flash write pages, erase blocks or some other suitable memory unit, for each constituent flash memory die. The parity chunk PA is a result of determining the parity of the data stripe 404A. The parity chunk PB is a result of determining the parity of the data stripe 404B. The parity chunk PM is a result of determining the parity of the data stripe 404M. PN represents the parity meta-data chunk stored in a flash memory die 402N with its value being the parity of the parity data chunks PA through PM.

The system may be configured to be responsive to the relative size of "data chunk" sizes and the use of a particular data chunk size relative to the impact on the system. A data chunk may have a size equivalent to an erase block, or some other suitable unit of size associated with the memory. For example, each of A0 . . . AN may correspond to an erase block in the respective flash memory die 402A . . . 402N. In such cases, data associated with the stripe 404A may be written to the erase blocks A0 through AN in the flash memory dice 402A through 402N, respectively.

As described above, in addition to the striping, the data may be redundantly stored in different flash memory dice at the granularity of erase blocks, or some other suitable unit of size associated with the memory. For example, data that is striped in 404A in data chunks of size equivalent to erase blocks may be replicated in a different group of flash memory dice. In some implementations, the data may be redundantly stored using parity encoding, such as XOR encoding, as described previously. In some other implementations, the data may be replicated using mirroring, while in some other implementations, the data may be redundantly stored using some suitable combination of parity encoding and mirroring, and/or some other appropriate mechanisms.

In one configuration, the data chunks for a data stripe may be written to 8 flash memory dice. Referring to the example of a flash memory die package with 8 dice arranged in 4 pairings with one die of each pair active at a given time for I/O operations, the above configuration may include the 4 active (considered from an I/O operations perspective) dice from one package, such as 212, and 4 active dice from another package, such as 214. The data chunks written to the 4 active dice in a package may be replicated in the other 4 sibling dice in the respective package. In this manner, the data may be striped and replicated to provide RAID-like reliability. In some implementations, depending on factors such as the configuration of the slave controller and channels relative to the number of memory dice, other configurations may be used. For example, the data chunks may be striped across 8 different dice in 8 different packages along with parity encoding to provide the ability to reconstruct the data chunks in the event of the loss of any single die or package.

A group of flash memory dice that are involved in storing and replicating data in the above manner may be considered to constitute a RAID group. In this context, a RAID group is associated with a collection of erase blocks that are aligned at the same memory address offset for each flash memory die in the RAID group. In the above example, the RAID group constitutes 16 flash memory dice across 2 packages. The RAID group has a "width" of 8, that is, data chunks in a data stripe are stored across 8 flash memory dice and replicated in 8 other flash memory dice.

The group 400B shown in FIGS. 4B and 4C illustrate an alternative implementation of a flash-aware RAID data layout. The group 400B includes 8 flash memory dice 408A, 408B, 408C, 408D, 408E, 408F, 408G and 408H, which may be collectively referred to as 408A-408H. The flash memory dice 408A-408H may belong to different packages or some of them may be included in the same package, or some other suitable configuration. The flash memory dice 408A-408H may be same as some of the flash memory dice 212A . . . 212N, or 214A . . . 214N, or 232A . . . 232N.

As shown in FIG. 4B, in one example striping configuration, pages of data may be stored across the flash memory dice 408A-408H in 14 data stripes 410A, 410B through 410N, which may be collectively referred to as 410A-410N. Each stripe includes 8 data chunks, such as A0, A1, A2, A3, A4, A5, A6 and A7 for data stripe 410A, B0, B1, B2, B3, B4, B5, B6 and B7 for data stripe 410B and N0, N1, N2, N3, N4, N5, N6 and N7 for data stripe 410N. Each of the data chunks is 512 bytes in size.

The configuration shown in FIG. 4B also stores two parity stripes 412A and 412B across the 8 flash memory dice 408A-408H. The parity stripe 412A includes parity chunks P_A, P_B, P_C, P_D, P_E, P_F, P_G and a single meta-data parity chunk P_A_G. The parity stripe 412B includes parity chunks P_H, P_I, P_J, P_K, P_L, P_M, P_N and the meta-data parity chunk P_H_N. Each parity chunk and meta-data parity chunk is 512 bytes in size.

In the configuration described above, there are 14 parity chunks in all, one for each data stripe. For example, P_A may be the parity encoding for the data chunks A0, A1, A2, A3, A4, A5, A6 and A7. The meta-data parity chunk P_A_G is parity encoding of the parity chunks P_A, P_B, P_C, P_D, P_E, P_F and P_G. Similarly, the meta-data parity chunk P_H_N is parity encoding of the parity chunks P_H, P_I, P_J, P_K, P_L, P_M and P_N.

The 14 data chunks and the 2 parity chunks that are stored in a flash memory die together constitute a write page. For example, the data chunks A0, B0 through N0, along with the parity chunks P_A and P_H, together make up a write page. With the size of each chunk being 512 bytes, the size of the write page is 8 KB. In some implementations, the data chunks and parity chunks may span a portion of a write page. In some other implementations, the data chunks and parity chunks may span multiple write pages.

In some implementations, the parity encoding used for computing the parity chunks or the meta-data parity chunk may be XOR encoding, while in other implementations, some other suitable encoding scheme may be used. With XOR encoding, all the data chunks may be recovered even if one of the flash memory dice fails. The recovery may be performed by first retrieving the corresponding parity chunk. For example, if flash memory die 408E fails such that data chunk A4 is unavailable, A4 may be recreated by performing an XOR operation on A1, A2, A3, A5, A6, A7 and P_A.

The data chunks may be recovered even if the corresponding parity chunk is not available. For example, if flash memory die 408A fails such that data chunk A1 and the parity chunk P_A are unavailable, P_A may be recreated in the first step of the recovery by performing an XOR operation on P_B, P_C, P_D, P_E, P_F, P_G and P_A_G. Subsequently, A1 may be recovered by performing an XOR operation on A2, A3, A4, A5, A6, A7 and the newly reconstructed P_A.

FIG. 4C shows the striping configuration for the group 400B updated to accommodate for the failure of a flash memory die. For example, flash memory die 408C may have failed, as shown in FIG. 4C. In the case of such an event, the flash memory dice 408A-408H are dynamically restriped.

In the degraded configuration, data is striped across the flash memory dice 408A, 408B and 408E-408H. Flash memory die 408C is not used since it has failed. Flash memory die 408D is also not used because of it is chunked along with die 408C. In some implementations, flash memory die groupings, such as flash memory dice 408C and 408D being chunked together, can arise because of sharing of hardware or software control paths. Such sharing allows control interactions with a group of dice to be made more efficient by carrying out the same command in a coordinated fashion across all of the dice belonging to the group.

The data encoding in the degraded configuration stripes the data in 8 stripes 414A and 414B through 414G and 414H across the flash memory dice 408A, 408B and 408E-408H, instead of the 14 data stripes shown in the normal configuration of FIG. 4B. In addition, the data chunks and the parity chunks may be stored in the same stripes, instead of having separate stripes for the data chunks and the parity chunks, as in FIG. 4B. For example, the data-and-parity stripe 414B includes the data chunks A6 and A7, and the parity chunks P_Aa, P_Ab, P_Ac and P_Ad.

Each of the data chunks and the parity chunks are 1 KB in size. Each flash memory die 408A, 408B, 408E-408H store 8 chunks of 1 KB each corresponding to the 8 data stripes 414A and 414B through 414G and 414H, which together constitute a write page. For example, flash memory die 408F stores the data chunks A3, H3, and the parity chunks P_Ab, P_Hb in a write page. With the size of each chunk being 1 KB, the size of the write page is 8 KB.

The parity chunks P_Aa, P_Ab, P_Ac and P_Ad, or the parity chunks P_Ha, P_Hb, P_Hc and P_Hd, may involve parity encoding functions that are different from the XOR encoding described previously. In some implementations, the parity encoding functions used to compute the parity chunks in FIG. 4C are more complex than the XOR encoding function.

As described by the FIGS. 4A and 4B-4C, techniques may be used such that data in a flash memory die are replicated at the granularity of write pages, erase blocks or some other suitable size unit of the memory. When portions of a flash memory die are in a degraded state, the data chunks that are stored in the degraded portions are replaced by copies from some other flash memory die where the data chunks are replicated. For example, the data chunks in a flash memory die may be replicated in its sibling die. The data may be replicated by mirroring, or by re-computing the data chunk based on the other data chunks and the parity chunk, or both. In this case, the RAID stripe and redundant or spare data are associated with the erase block level or some other suitable size unit of the memory.

In some cases, an entire flash memory die may fail for various reasons, such as hardware failure. In such cases, all the erase blocks, or some other suitable size unit of the memory that is used, in the flash memory die are considered to be in a degraded state. However, the sibling die may be fully functional and include all the erase blocks corresponding to the failed die. In some other cases, both the flash memory dice in a pair may fail, for example, due to a failure in the I/O interface. In such cases, all the erase blocks, or some other suitable size unit of the memory that is used, in the pair of flash memory dice are considered to be in a degraded state.

Various mechanisms may be used to monitor the state of a memory card, such as the card 200. For example, the co-pending U.S. application Ser. No. 13/841,026, titled "System and Method to Improve Enterprise Reliability Through Tracking I/O Performance Metrics in Non-Volatile Random Access Memory," which is incorporated in its entirety herein by reference, describes methods and systems that may be used to check on the status of flash memory dice in a memory card. By using such instrumentation, it may be determined how the flash memory dice in the memory card are behaving relative to failure thresholds. The instrumentation may be used to identify the state of each block of a flash memory die. The instrumentation may be performed by the memory controller, such as 206, or by the processors mounted on the memory card, or by the processors in the host system, or any other suitable entity, including suitable combinations of the above.

Using the instrumentation as indicated above, a flash memory die may be determined to be in one of several phases. When the flash memory die is operating without any error, the die is in the normal phase. At this stage, the state of the flash memory die is monitored and no action is taken.

When one or more regions of the flash memory die is in a degraded state such that the data chunks stored in the degraded regions cannot be read, the flash memory die may be considered to be in the failure phase. At this stage, the memory controller and/or the processors initiate actions to replace the erase blocks, or some other suitable size unit of the memory, in the degraded portions of the flash memory die with spare memory blocks from other flash memory die.

The flash memory die is then in the recovery phase. The memory controller and/or the processors recover the data chunks that were stored in the degraded portions of the die using the mirrored data, or by re-computing the data from the other data chunks associated with the data stripe and the parity chunk associated with the data stripe that included the degraded data chunks. The recovered data is stored in the spare memory blocks, which are now included in the data stripe.

Once the data is recovered, the faulty flash memory die with the degraded portions are treated in the post-recovery phase. In some implementations, the degraded portions of the faulty die may be wiped to recover the capacity for subsequent use. In some other implementations, the degraded portions of the faulty die cannot be recovered, but the flash memory die may have sufficient remaining capacity that is functioning normally. In either case, the flash memory die may be reintroduced in a RAID group by dynamically re-striping the flash memory die.

The faulty flash memory die may be dynamically re-striped as part of a RAID group with a fewer number of data stripes. For example, the flash memory die may be grouped with other faulty die and reintroduced into a new RAID group with 14 stripes. The new RAID group includes the flash memory die with the erase block, or some other suitable size unit of memory that is used for storing data chunks, corresponding to the degraded portion of the die removed from the data stripes. An additional erase block also may be removed due to practical implementation considerations (for example, due to chunking of blocks/dice).

The new RAID group may have a separate data striping scheme that is needed to provide the desired level of redundancy. In some implementations, the data striping scheme may factor in the priority of the data that is to be stored. For example, for particular user data, the RAID group may use RAID level 5 (RAID5) encoding of the data. For metadata or other critical data, the RAID group may replicate the data in disjoint flash memory dice.

For example, A0 ... AN, B0 ... BN and M0 ... MN may be erase blocks of the flash memory dice 402A ... 402N. The data stripes 404A, 404B ... 404N may be RAID stripes, each of width 8, which are implemented using the erase blocks A0 ... AN, B0 ... BN and M0 ... MN respectively, where N=8. The RAID stripe 404A involving erase blocks A0 ... AN across the 8 flash memory dice may be in "normal phase" (that is, all 8 erase blocks A0 ... AN are functioning and error-free). However, another RAID stripe, for example 404B involving erase blocks B0 ... BN may be in the post-recovery phase, with flash memory die 402C having the erase block B2 in a bad or degraded (error) state.

In this case, a data layout that is used for the data stored in the RAID stripe 402A may be different from the data layout that is used for the data stored in the RAID stripe 402B. For the latter, the data layout used may be "degradation-aware," such that no data chunk is stored in the erase block B2, that is, data stripe 402B does not have any data stored in flash memory die 402C.

In one sense, a combination of a memory controller (either a master or a slave controller) and a software driver (for example, running on the host system processors or the processors embedded on the memory card) rely on instrumentation of memory, the controlled channels, and the overall application and system context to control the use of mirroring and/or parity encoding within the memory controller. Generally, the memory controller and/or the software driver use the instrumentation to determine the relative performance of a particular memory region. The memory controller and/or the software driver may monitor the response and access times and error levels to determine the performance of a memory region relative to an overall failure rate. With this information, the combination of a memory controller and a software driver may set the state of the memory region as being (1) normal, (2) degraded, (3) recovery ongoing, or (4) recovered (or offline) flash areas. This may depend on the overall context of the application and environment. In high memory and/or system utilization contexts (for example, application workloads exhibiting high thread counts), the memory controller and/or software driver may elect to use memory regions that that would not be used in lower utilizations.

The memory controller/software driver combination may receive signals indicative of parity errors as part of performing data read accesses—thereby detecting them in real time. Alternatively, the memory controller/software driver may perform system testing to ascertain the state of the memory. The memory controller/software driver also may track the state of the memory region based on prior access times in order to ascertain whether a particular region of memory is likely to show degraded behavior in the future. In some implementations, the memory controller/software driver may track the state of the memory region to determine whether it is ready to support a "fast write" or whether the memory is likely to perform a memory operation (e.g., a write) at a slower rate. This instrumentation data may be used to make RAID configuration layout decisions by the memory controller/software driver.

With the above context, each erase block or some other suitable size unit of memory that is used to store data chunks may have a spare. In this context, a spare can be considered to be storage capacity in each flash memory die that is used as backups for degraded portions of the flash memory dice that are storing data. The ability of the memory card to tolerate degradations in the flash memory dice, in a manner that is transparent to the host system, is proportional to the amount of spare capacity that is included in the flash memory dice.

In some configurations, the memory controller/software driver employs spare handling operations in order to set aside regions of memory that can be accessed for additional striping (RAID-aware) operations in the future. The spare handling operations may reduce the active memory and may be configured to support a "silent" configuration so that the memory controller/software driver only perform these operations in the background. The memory controller/software driver may select a striping (RAID) encoding configuration from among multiple redundancy encodings for the degraded flash area. As noted, and depending on utilization, different types of data may end up using different redundancy encodings or may request skipping blocks from degraded areas altogether. A spare may be thought of as RAID stripes (either in normal operation or in degraded state) that are dynamically chosen from a pool of available erase blocks, or some other suitable size unit of memory, that is configured at the initialization time of the memory card 200. The pool corresponds to the difference between the available capacity of the flash memory dice and the capacity that is advertised to the host system. For example, the available capacity may be 100 RAID stripes, but the advertised capacity may be 80 RAID stripes. Therefore, there may be 20 RAID stripes that can be used as spares. In some implementations, the 20 spare RAID stripes may not be statically defined; instead, they may rotate over the entire space of the 100 RAID stripes and are dynamically defined by the stripes not currently used for storing the contents of the advertised storage capacity. Over time, the space reserve of 20 stripes may be consumed, for example, by replacing a higher-capacity (fully functional) RAID stripe with a partial-capacity (recovered/degraded) RAID stripe, and in other cases by completely retiring a data stripe that has encountered more than a threshold of errors. When there are no more spare RAID stripes available, that is, the advertised limit of 80 RAID stripes is approached, the memory card 200 is in placed in a degraded mode, and eventually new operations are not performed on the memory card.

Figure 5:
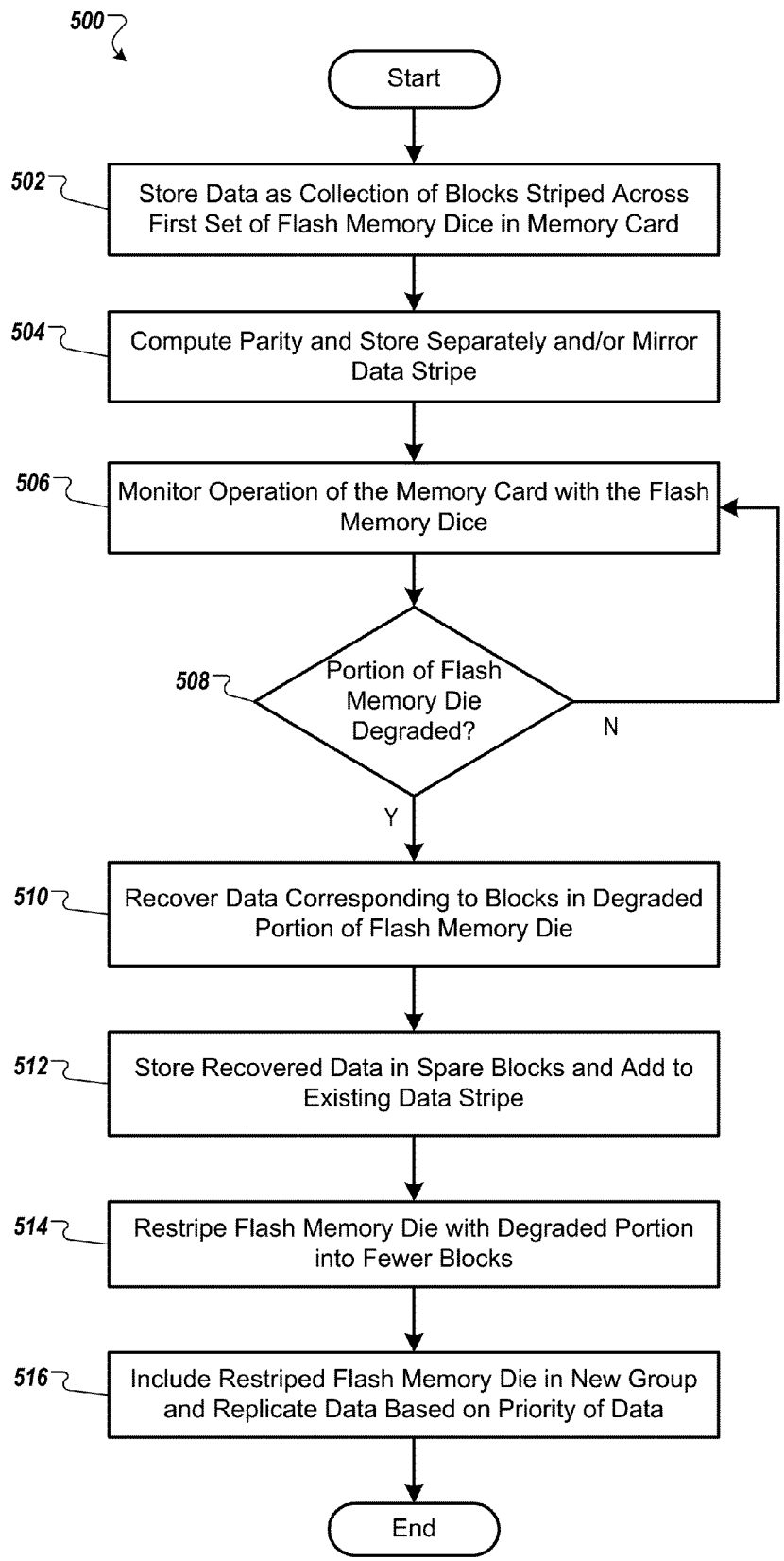
FIG. 5 illustrates an exemplary process that may be used for performing data striping at the granularity of sub-sections of flash memory chips, and for dynamically re-striping flash memory chips that include degraded portions.

FIG. 5 illustrates an exemplary process 500 that may be used for performing data striping at the granularity of subsections of flash memory chips, and for dynamically re-striping flash memory chips that include degraded portions. The process 500 may be performed to manage the flash memory dice on the memory card 200. The following sections describe the process 500 as performed by the memory controller 206. However, the process 500 also may be performed by the processors included in the memory card 200, by the processors in the host system that includes the memory card 200, or by a suitable combination of the memory controller 206, the processors in the memory card 200 and the processors in the host system may perform the process 200. The process 500 also may be implemented by other systems and system configurations.

The process 500 starts by storing data as a collection of blocks striped across a first set of flash memory dice in a memory card (502). For example, the memory controller 206 may store data in a data stripe, such as 404A, 404B or 404M in the flash memory dice 402A ... 402N. The data chunks A0 ... AN, B0 ... BN, M0 ... MN may correspond to erase blocks, or some other suitable unit of memory in the respective flash memory die.

Parity is computed on the data stripe and stored separately, and/or the data stripe is mirrored (504). For example, the memory controller 206 may compute parity on the chunks A0 ... AN for the data stripe 404A and stored as parity chunk PA. Similarly, PB is the parity chunk storing parity data computed on the chunks B0 ... BN in data stripe 404B, while PM is the parity chunk storing parity data computed on the chunks M0 ... MN in data stripe 404M. The parity chunks PA, PB and PM are stored in a separate parity stripe 406, as described previously.

In addition, or as an alternative, to computing parity on the data stripes, the memory controller 206 may provide redundancy to the data stripe by mirroring the data chunks in additional memory blocks on other flash memory dice. For example, each of the data chunks A0 ... AN may be mirrored in the sibling of the flash memory die 402A ... 402N respectively.

The operation of the memory card with the flash memory dice is monitored (506). For example, the memory controller 206 may monitor the operation of the memory card 200 using the various instrumentation mechanisms described previously.

It is determined whether any portion of any of the flash memory die is degraded (508). For example, as part of monitoring the operation of the memory card 200, the memory controller 206 may check whether the various regions of the flash memory dice 402A ... 402N that stored the data chunks A0 ... An, B0 ... BN and M0 ... MN are operating in the normal phase, or are transitioning into the failure phase, that is, in a degraded state. In some implementations, whether a flash memory die is degraded may be detected as a side-effect of detecting an input/output operation failure.

If it is determined that all the flash memory dice are operating in the normal phase, the memory controller 206 or the processors continues to monitor the operation of the memory card with the flash memory dice (506). On the other hand, if it is determined that one or more portions of one or more flash memory dice are in a degraded state, then the flash memory dice with the degraded portions are placed in recovery phase.

In the recovery phase, for a faulty flash memory die, the data corresponding to the blocks in the degraded portion of the flash memory die are recovered (510). For example, the memory controller 206 may re-compute the degraded data chunks, which were stored in the degraded portion of the flash memory die, using the remaining data chunks and the parity chunk corresponding to the data stripe that included the data chunks stored in the degraded portion of the flash memory die. Alternatively, the memory controller may recover the degraded data chunks from the mirrored copies that are stored in other flash memory dice.

The recovered data are stored in spare blocks and added to the existing data stripe (512). For example, the memory controller 206 may copy the recovered data chunks into spare erase blocks, or some other suitable unit of memory, in other flash memory dice. The memory controller may reconfigure the data stripe that included the degraded data chunks to include the new data chunks, replacing the degraded data chunks.

The flash memory die with the degraded portion is restriped into fewer blocks (514). For example, the memory controller 206 may treat the flash memory die with the degraded portions in the post-recovery phase. The memory controller 206 may wipe the degraded portions of the faulty die to recover the capacity for subsequent use. Even if the degraded portions of the faulty die cannot be recovered, the flash memory die may have sufficient remaining capacity that is functioning normally. The memory controller 206 may dynamically re-stripe the faulty flash memory die with a fewer number of data stripes. The number of data stripes that can be accommodated depends on the number of erase blocks, or some other suitable unit of memory, that are covered by the degraded portion of the flash memory die. For example, the degraded portion of the flash memory die may cover one erase block. An additional erase block also may be removed due to practical implementation considerations. Therefore, the flash memory die may be re-striped to store data chunks for 14 data stripes, instead of the original 16 data stripes.

In general, after an error has been discovered in a RAID group the RAID group may be considered to be in a degraded state. Once recovery has been completed, the portions of flash memory corresponding to the RAID group in the degraded state may be made available for subsequent use by the system. In some implementations, the degraded memory block(s) may be re-used to store different types of data at different future points in time. Depending on the type of data, different RAID encodings may be employed for the degraded memory block(s) (for example, a mirrored encoding for metadata/small-block data, where the faulty dice are not used, or a more-involved RAIDS-like data/parity encoding that works around a faulty die). In some implementations, some types of data may request that they not be stored in degraded blocks. For example, mission critical data (such as metadata or high utilization data) may be designated for coding in non-degraded memory.

The restriped flash memory die is included in a new group and the data is replicated using parity encoding and/or mirroring based on the priority of the data (516). For example, the memory controller 206 may group the re-striped flash memory die with other faulty die and reintroduce into a new RAID group with 14 data stripes. The memory controller 206 may implement a data striping scheme in the new RAID group that satisfies the desired level of redundancy for the data stored in the new RAID group. The memory controller 206 may factor in the priority of the data that is to be stored while determining the data striping scheme. For example, for user data, the memory controller 206 may use RAIDS encoding. For critical data such as metadata, the memory controller may replicate the data chunks in the corresponding data stripe in disjoint flash memory dice.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The elements of a computer may include a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of implementations have been described. Nevertheless, it will be understood that various modifications may be made without departing from the spirit and scope of the invention. For example, much of this document has been described with respect to messaging and mapping applications, but other forms of graphical applications may also be addressed, such as interactive program guides, web page navigation and zooming, and other such applications.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A method comprising:
   storing data as a first collection of memory blocks distributed across a first set of memory devices;
   determining that a first memory device included in the first set is in a degraded state;
   based on determining that the first memory device included in the first set is in the degraded state, recovering data corresponding to a first memory block included in the first collection of memory blocks and stored in the first memory device, wherein the first memory device is configured to include a first number of memory blocks;
   storing the recovered data as a new memory block in a second memory device, the new memory block added to the first collection of memory blocks;
   removing the first memory device from the first set of memory devices;
   reconfiguring the first memory device with a second number of memory blocks that is less than the first number of memory blocks; and
   storing, in the reconfigured first memory device, memory blocks included in a second collection of memory blocks that is distributed across a second set of memory devices.

2. The method of claim 1, wherein storing data as the first collection of memory blocks distributed across the first set of memory devices comprises:
   computing parity data on the first collection of memory blocks; and
   storing the parity data as a memory block in a memory device.

3. The method of claim 2, wherein storing the parity data as a memory block in a memory device comprises storing the parity data as a memory block in a memory device that is distinct from memory devices included in the first set of memory devices.

4. The method of claim 2, wherein recovering the data comprises:
   determining the data corresponding to the first memory block included in the first collection of memory blocks and stored in the first memory device based on the parity data and remaining memory blocks included in the first collection of memory blocks.

5. The method of claim 4, wherein the remaining memory blocks are stored in remaining memory devices included in the first set of memory devices, other than the first memory device.

6. The method of claim 1, comprising:
   replicating data corresponding to the memory blocks stored in the reconfigured first memory device based on a priority associated with the data.

7. The method of claim 6, comprising:
   based on determining that the data corresponding to the memory blocks stored in the reconfigured first memory device include user data, replicating the data using Redundant Array of Independent Disks level 5 (RAID 5) encoding.

8. The method of claim 6, comprising:
   based on determining that the data corresponding to the memory blocks stored in the reconfigured first memory device include metadata, replicating the data in memory devices that are distinct from the first memory device.

9. The method of claim 8, wherein the metadata include information associated with at least one of configuration and operation of the memory devices.

10. The method of claim 1, wherein reconfiguring the first memory device with the second number of memory blocks that is less than the first number of memory blocks comprises:
    reconfiguring the first memory device such that a portion of the first memory device that stored the first memory block is unused; and
    storing the second number of memory blocks in remaining portions of the first memory device other than the portion of the first memory device that stored the first memory block.

11. The method of claim 1, wherein the first set of memory devices and the second set of memory devices are included in a memory card.

12. The method of claim 1, wherein at least one memory device is common to the first set of memory devices and the second set of memory devices.

13. The method of claim 1 wherein storing the memory blocks included in the second collection of memory blocks comprises:
    computing second parity data on the second collection of memory blocks using a second encoding scheme that is different from a first encoding scheme used for the first collection of memory blocks; and
    storing the second parity data as a memory block in the second set of memory devices.

14. The method of claim 13, wherein the second encoding scheme is selected based on a type of data associated with the second collection of memory blocks.

15. The method of claim 1, comprising:
    based on the second set of memory devices including the first memory device with the degraded state, identifying the second set of memory devices as associated with a degraded memory state; and responsive to identifying the second set of memory devices as associated with the degraded memory state, preventing storage of a certain category of data in the second set of memory devices.

16. The method of claim 15, wherein the certain category of data includes one of metadata or high-utilization data.

17. A system comprising:
a processor; and
instructions encoded in a non-transitory machine-readable medium for execution by the processor and, when executed, configured to cause the processor to perform operations comprising:
storing data as a first collection of memory blocks distributed across a first set of memory devices;
determining that a first memory device included in the first set is in a degraded state;
based on determining that the first memory device included in the first set is in the degraded state, recovering data corresponding to a first memory block included in the first collection of memory blocks and stored in the first memory device, wherein the first memory device is configured to include a first number of memory blocks;
storing the recovered data as a new memory block in a second memory device, the new memory block added to the first collection of memory blocks;
removing the first memory device from the first set of memory devices;
reconfiguring the first memory device with a second number of memory blocks that is less than the first number of memory blocks; and
storing, in the reconfigured first memory device, memory blocks included in a second collection of memory blocks that is distributed across a second set of memory devices.

18. The system of claim 17, wherein the instructions that are configured to cause the processor to perform operations comprising storing data as the first collection of memory blocks distributed across the first set of memory devices include instructions that are configured to cause the processor to perform operations comprising:
computing parity data on the first collection of memory blocks; and
storing the parity data as a memory block in a memory device.

19. The system of claim 18, wherein the instructions that are configured to cause the processor to perform operations comprising storing the parity data as a memory block in a memory device include instructions that are configured to cause the processor to perform operations comprising storing the parity data as a memory block in a memory device that is distinct from memory devices included in the first set of memory devices.

20. The system of claim 18, wherein the instructions that are configured to cause the processor to perform operations comprising recovering the data include instructions that are configured to cause the processor to perform operations comprising:
determining the data corresponding to the first memory block included in the first collection of memory blocks and stored in the first memory device based on the parity data and remaining memory blocks included in the first collection of memory blocks.

21. The system of claim 20, wherein the remaining memory blocks are stored in remaining memory devices included in the first set of memory devices, other than the first memory device.

22. The system of claim 17, wherein the instructions are configured to cause the processor to perform operations comprising:
replicating data corresponding to the memory blocks stored in the reconfigured first memory device based on a priority associated with the data.

23. The system of claim 22, wherein the instructions are configured to cause the processor to perform operations comprising:
based on determining that the data corresponding to the memory blocks stored in the reconfigured first memory device include user data, replicating the data using Redundant Array of Independent Disks level 5 (RAID 5) encoding.

24. The system of claim 22, wherein the instructions are configured to cause the processor to perform operations comprising:
based on determining that the data corresponding to the memory blocks stored in the reconfigured first memory device include metadata, replicating the data in memory devices that are distinct from the first memory device.

25. The system of claim 24, wherein the metadata include information associated with at least one of configuration and operation of the memory devices.

26. The system of claim 17, wherein the instructions that are configured to cause the processor to perform operations comprising reconfiguring the first memory device with the second number of memory blocks that is less than the first number of memory blocks include instructions that are configured to cause the processor to perform operations comprising:
reconfiguring the first memory device such that a portion of the first memory device that stored the first memory block is unused; and
storing the second number of memory blocks in remaining portions of the first memory device other than the portion of the first memory device that stored the first memory block.

27. The system of claim 17, wherein the first set of memory devices and the second set of memory devices are included in a memory card.

28. The system of claim 17, wherein at least one memory device is common to the first set of memory devices and the second set of memory devices.

29. The system of claim 17, wherein the instructions that are configured to cause the processor to perform operations comprising storing the memory blocks included in the second collection of memory blocks include instructions that are configured to cause the processor to perform operations comprising:
computing second parity data on the second collection of memory blocks using a second encoding scheme that is different from a first encoding scheme used for the first collection of memory blocks; and
storing the second parity data as a memory block in the second set of memory devices.

30. The system of claim 29, wherein the second encoding scheme is selected based on a type of data associated with the second collection of memory blocks.

31. The system of claim 17, wherein the instructions are configured to cause the processor to perform operations comprising:
based on the second set of memory devices including the first memory device with the degraded state, identifying the second set of memory devices as associated with a degraded memory state; and responsive to identifying the second set of memory devices as associated with the degraded memory state, preventing storage of a certain category of data in the second set of memory devices.

32. The system of claim 31, wherein the certain category of data includes one of metadata or high-utilization data.

33. A computer program product, implemented in a non-transitory machine-readable medium and including instructions for execution by a processor, the instructions, when executed, configured to cause the processor to perform operations comprising:
storing data as a first collection of memory blocks distributed across a first set of memory devices;
determining that a first memory device included in the first set is in a degraded state;
based on determining that the first memory device included in the first set is in the degraded state, recovering data corresponding to a first memory block included in the first collection of memory blocks and stored in the first memory device, wherein the first memory device is configured to include a first number of memory blocks;
storing the recovered data as a new memory block in a second memory device, the new memory block added to the first collection of memory blocks;
removing the first memory device from the first set of memory devices;
reconfiguring the first memory device with a second number of memory blocks that is less than the first number of memory blocks; and
storing, in the reconfigured first memory device, memory blocks included in a second collection of memory blocks that is distributed across a second set of memory devices.

34. The computer program product of claim 33, wherein the instructions that are configured to cause the processor to perform operations comprising storing data as the first collection of memory blocks distributed across the first set of memory devices include instructions that are configured to cause the processor to perform operations comprising:
computing parity data on the first collection of memory blocks; and
storing the parity data as a memory block in a memory device.

35. The computer program product of claim 34, wherein the instructions that are configured to cause the processor to perform operations comprising storing the parity data as a memory block in a memory device include instructions that are configured to cause the processor to perform operations comprising storing the parity data as a memory block in a memory device that is distinct from memory devices included in the first set of memory devices.

36. The computer program product of claim 34, wherein the instructions that are configured to cause the processor to perform operations comprising recovering the data include instructions that are configured to cause the processor to perform operations comprising:
determining the data corresponding to the first memory block included in the first collection of memory blocks and stored in the first memory device based on the parity data and remaining memory blocks included in the first collection of memory blocks.

37. The computer program product of claim 36, wherein the remaining memory blocks are stored in remaining memory devices included in the first set of memory devices, other than the first memory device.

38. The computer program product of claim 33, wherein the instructions are configured to cause the processor to perform operations comprising:
replicating data corresponding to the memory blocks stored in the reconfigured first memory device based on a priority associated with the data.

39. The computer program product of claim 38, wherein the instructions are configured to cause the processor to perform operations comprising:
based on determining that the data corresponding to the memory blocks stored in the reconfigured first memory device include user data, replicating the data using Redundant Array of Independent Disks level 5 (RAID 5) encoding.

40. The computer program product of claim 38, wherein the instructions are configured to cause the processor to perform operations comprising:
based on determining that the data corresponding to the memory blocks stored in the reconfigured first memory device include metadata, replicating the data in memory devices that are distinct from the first memory device.

41. The computer program product of claim 40, wherein the metadata include information associated with at least one of configuration and operation of the memory devices.

42. The computer program product of claim 33, wherein the instructions that are configured to cause the processor to perform operations comprising reconfiguring the first memory device with the second number of memory blocks that is less than the first number of memory blocks include instructions that are configured to cause the processor to perform operations comprising:
reconfiguring the first memory device such that a portion of the first memory device that stored the first memory block is unused; and
storing the second number of memory blocks in remaining portions of the first memory device other than the portion of the first memory device that stored the first memory block.

43. The computer program product of claim 33, wherein the first set of memory devices and the second set of memory devices are included in a memory card.

44. The computer program product of claim 33, wherein at least one memory device is common to the first set of memory devices and the second set of memory devices.

45. The computer program product of claim 33, wherein the instructions that are configured to cause the processor to perform operations comprising storing the memory blocks included in the second collection of memory blocks include instructions that are configured to cause the processor to perform operations comprising:
computing second parity data on the second collection of memory blocks using a second encoding scheme that is different from a first encoding scheme used for the first collection of memory blocks; and
storing the second parity data as a memory block in the second set of memory devices.

46. The computer program product of claim 45, wherein the second encoding scheme is selected based on a type of data associated with the second collection of memory blocks.

47. The computer program product of claim 33, wherein the instructions are configured to cause the processor to perform operations comprising:
based on the second set of memory devices including the first memory device with the degraded state, identifying the second set of memory devices as associated with a degraded memory state; and
responsive to identifying the second set of memory devices as associated with the degraded memory state, preventing storage of a certain category of data in the second set of memory devices.

48. The computer program product of claim 47, wherein the certain category of data includes one of metadata or high-utilization data.

* * * * *